United States Patent [19]
Watanabe et al.

[11] Patent Number: 4,910,094
[45] Date of Patent: Mar. 20, 1990

[54] MULTILAYER PLATING METHOD AND MULTILAYER PLATED FILM

[75] Inventors: Tetsuya Watanabe, Hadano; Masao Sekibata, Kunitachi, both of Japan

[73] Assignee: Hitachi, Ltd., Tokyo, Japan

[21] Appl. No.: 247,538

[22] Filed: Sep. 22, 1988

[30] Foreign Application Priority Data

Sep. 25, 1987 [JP] Japan .................................. 62-238976

[51] Int. Cl.$^4$ .......................... B32B 15/04; B05D 3/12
[52] U.S. Cl. ..................................... 428/610; 428/665; 428/680; 427/123; 427/290
[58] Field of Search ............... 427/123, 125, 355, 290, 427/404; 428/610, 612, 665, 680, 672, 615, 941; 204/37.1

[56] References Cited

U.S. PATENT DOCUMENTS

| | | | |
|---|---|---|---|
| 3,963,455 | 6/1976 | Nobel et al. | 428/665 |
| 4,626,479 | 12/1986 | Hosoi et al. | 428/665 |
| 4,655,884 | 4/1987 | Hills et al. | 204/37.1 |
| 4,685,030 | 8/1987 | Reyes et al. | 427/99 |
| 4,752,499 | 6/1988 | Enomoto | 427/98 |

FOREIGN PATENT DOCUMENTS 58-204194 11/1983 Japan .

*Primary Examiner*—John J. Zimmerman
*Attorney, Agent, or Firm*—Fay, Sharpe, Beall, Fagan, Minnich & McKee

[57] ABSTRACT

A primary plated film is formed on the surface of underlayer metal. Next, the heating process is performed and diffusion layers of the underlayer metal and primary plated film are formed. A mechanical abrasion is performed to the surface of the primary plated film, thereby exposing the diffusion layers. Thereafter, a secondary plated film is formed on the exposed diffusion layers. With this multilayer plating method, even in the case of the dissimilar metals, a uniform multilayer plated film of a good adhesive property is derived.

11 Claims, 1 Drawing Sheet

MULTILAYER PLATING METHOD AND MULTILAYER PLATED FILM

BACKGROUND OF THE INVENTION

The present invention relates to a method of forming a multilayer plated film and, more particularly, to a multilayer plating method which is suitable when an Ni or Ni-Au plated film for installation of parts is formed on a metalized layer on a ceramic substrate.

Hitherto, as a method of forming a multilayer plated film onto a dissimilar metal, for example, as a method of electrically plating an Ni-Au film necessary for installation of parts onto a W layer, there has been known a method whereby as an underlayer to perform an electric Ni plating onto a W layer, an electroless Ni plating is first performed onto the W layer, or a method whereby in order to cover a defect of the electroless Ni plating, another electroless Ni plating is further performed thereon, or the like. This electroless Ni plated film is thermally treated in the reducing atmosphere, thereby improving the adhesive property between the Ni plated film and the underlayer metal. Due to the heat treatment, the surface of the electroless Ni plated film is polluted and decomposed or the diffusion or the like of the W layer as the underlayer metal occurs. Thus, the adhesive property between the surface of the electroless Ni paated film and a secondary Ni plated film which is formed thereon is poor.

A technique disclosed in, e.g., JP-A-No. 58-204194 or the like has been known as a conventional technique regarding such a kind of multilayer plating method.

In the multilayer plating method according to the foregoing conventional technique, no consideration is paid to a variation in the primary plated film on the dissimilar metal, a decomposition due to the heat treating process, or the like. There is a problem such that defective adhesion, discoloration or the like occurs in a secondary plated film which will be formed thereafter.

SUMMARY OF THE INVENTION

It is an object of the present invention to solve the problems in the conventional technique mentioned above and to provide a multilayer plating method whereby a uniform multilayer plated film having a good adhesive property can be formed on a dissimilar metal.

According to the present invention, prior to performing a primary plating, a decomposed portion of underlayer metal is removed by a mechanical abrasion and the primary plating is executed and a heat treatment is performed. After that, the mechanical abrasion is executed to eliminate the decomposed portion of the primary plated film with diffusion layers of the primary plated film and underlayer metal left.

By performing the mechanical abrasion, both of the dissimilar metal as an underlayer and the decomposed layer of the primary plated film can be eliminated and the surfaces of the dissimilar metal and primary plated film are made rough, so that an anchor effect is produced due to this. The primary plated film and a secondary plated film which is formed on the primary plated film are uniformly formed with a good adhesive property.

A uniform multilayer plated film with a good adhesive property is formed by the method of the invention mentioned above.

DESCRIPTION OF THE PREFERRED EMBODIMENT

An embodiment of a multilayer plating method according to the present invention will be described in detail hereinbelow with reference to the drawings.

Figure 1:
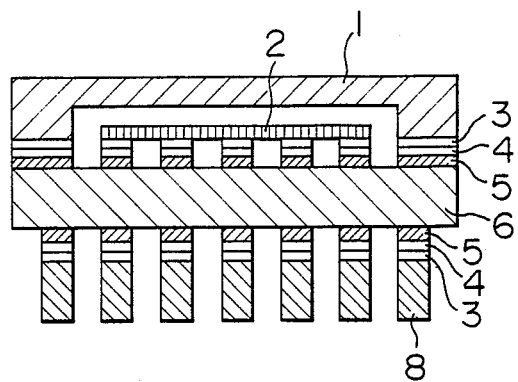
FIG. 1 is a cross sectional view showing an installing state of parts onto a module substrate using a multilayer plating according to the present invention.
Figure 2:
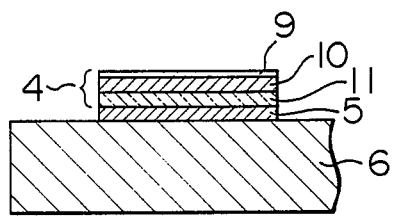
FIG. 2 is an enlarged cross sectional view of the multilayer plated film portion in FIG. 1.
Figure 3:
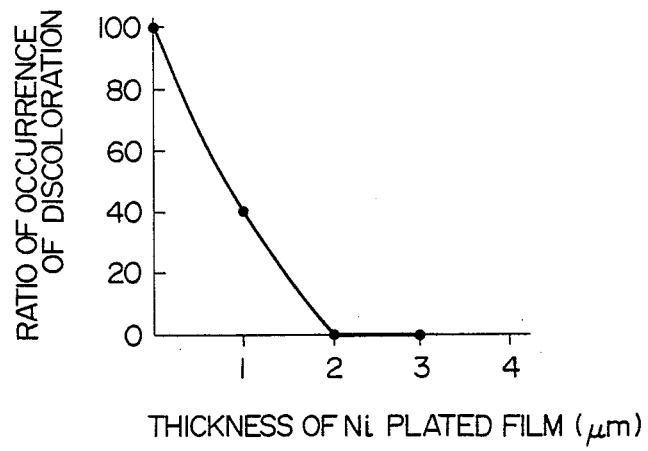
FIG. 3 is a diagram for explaining the relation between the thickness of Ni film and the ratio of the occurrence of the discoloration of an Au plated film.

FIG. 1 is a cross sectional view showing an installing state of parts onto a module substrate using the multilayer plating according to the invention. FIG. 2 is an enlarged cross sectional view of a multilayer plated film portion in FIG. 1. FIG. 3 is a diagram for explaining the relation between the thickness of Ni plated film and the ratio of the occurrence of the discoloration of an Au plated film. In FIGS. 1 and 2, reference numeral 1 denotes a cap; 2 is an LSI chip; 3 a soldering; 4 an Ni-Au plated film; 5 a wiring metalized layer; 6 a module substrate; 8 a lead; 9 an Au plated film; 10 a secondary Ni plated film; and 11 an Ni-W diffusion layer.

In general, the ceramic module substrate 6 in FIG. 1 is formed in a manner such that a plurality of green sheets in each of which circuit wirings are formed on both of the upper and lower surfaces by a screen printing method by using a paste of metal such as W or the like having a high melting point are adhered each other and integrated and, thereafter, the integrated sheets are baked. The NiAAu plated film 4 is formed on the wiring metalized layer 5 on the surface of the module substrate 6 by an electroless plating method. The LSI chip 2, cap 1, leads 8, or the like are formed over or below the Ni-Au plated film 4 through the soldering 3 as a solder.

When connecting parts to the module substrate 6, they can be connected by using only an Ni plated film in the case of the connection using the soldering 3. However, an Au plated film is generally necessary to improve the soldering wettability. This effect is also derived even when a thickness of Au plated film is set to 1 $\mu$m or less.

In the embodiment of the invention, to form the Ni-Au plated film 4, a reducing type plating method and a substituting type plating method are used. FIG. 2 shows an enlarged cross sectional view of the Ni-Au plated film 4 obtained by the embodiment of the invention. The multilayer plating method of the embodiment according to the invention will now be described hereinbelow with reference to FIG. 2.

First, a primary Ni plated film is formed on the surface of the wiring metalized layer 5 consisting of W on the module substrate 6 by using the reducing type plating method and, thereafter, it is heat treated in the reducing atmosphere to thereby form the diffusion layer 11 of Ni-W. Due to this, the adhesive property between the primary Ni plating film and the wiring metalized layer is improved.

Subsequently, the foregoing uneven primary Ni plated surface is eliminated by a surface etching in the honing process or the like as the mechanical abrasion, thereby exposing the diffusion layer 11 of Ni-W.

The secondary Ni plated film 10 is again formed on the diffusion layer 11 by the reducing type plating method. The Au plated film 9 is further formed on the secondary Ni plated film 10 by the substituting type plating method.

As show in FIG. 2, the Ni-Au plated film 4 obtained by such a method is the multilayer plated film in which the Ni-W diffusion layer 11, secondary Ni plated film 10, and Au plated film 9 are mutually coupled with a good adhesive property. The adhesive property with the wiring metalized layer of W is also good.

Each of the plating processing steps described above will now be further explained in detail.

(1) First, after an alumina honing was performed on the surface of the wiring metalized film 5 by, for instance, a wet process, it is sufficiently washed by using the water containing 10 to 20% of thermal caustic soda and is, further, cleaned by the acid. Subsequently, it is sufficiently washed by the water and a substituting type palladium activation is executed. Then, it is sufficiently washed by the water and the primary Ni plating is performed. The primary Ni plating is executed by using a commercially available plating liquid using, e.g., dimethyl amine borane as a reducing agent at liquid temperatures of 65° to 70° C. so that a thickness of Ni plated film is set to 3 μm. The Ni plated film thickness is controlled by a time and its processing time is determined by the bath temperature, pH, bath load, and the like.

(2) Next, in order to raise the adhesive property between the wiring metalized film 5 as an underlayer and the primary Ni plated film mentioned above, the heat treatment is executed in the reducing atmosphere, e.g., the mixed atmosphere of, e.g., $N_2$ gas and $H_2$ gas at temperatures of 800° to 900° C. for a time period of about 5 to 10 minutes, thereby forming the Ni-W diffusion layer 11.

(3) Next, the surface of the primary Ni plated film is etched by, for instance, the alumina honing due to the wet process. In this case, the etching is executed until the uniform Ni-W diffusion layer 11 is exposed.

(4) Next, the same preparation as the processes which were performed for the wiring metalized film 5 upon formation of the primary Ni plated film is executed for the Ni-W diffusion layer 11, thereby executing the substituting type palladium activation. Thereafter, the same plating process as that using the reducing agent of dimethyl amine borane as mentioned above is executed, thereby forming the secondary Ni plated film 10. In this plating process, Ni is first substituted for Pd and precipitated onto the surface of Ni-W. Thereafter, the precipitation of Ni as metal is started due to the autocatalytic function. A thickness of Ni plated film is set to about 3 μm. After completion of the secondary Ni plating process, the secondary Ni plated film is sufficiently washed by the water. The Au plated film 9 having a thickness of about 0.2 μm is formed by the substituting type plating process.

(5) Next, in order to raise the adhesive property between the secondary Ni plated film 10 and the Ni-W diffusion layer, the heat treatment is executed in the reducing atmosphere, e.g., in the mixed atmosphere of the $N_2$ gas and $H_2$ gas at temperatures of 400° to 500° C. for a time period of about 5 to 10 minutes.

In each of the plating processing steps mentioned above, the reason why the thickness of the secondary Ni plated film 10 was set to about 3 μm is not to cause a discoloration in the Au plated film 9 when the heat treatment is performed after the Au plated film 9 was formed on the secondary Ni plated film 10. FIG. 3 shows the relation between the thickness of the secondary Ni plated film 10 and the ratio of the occurrence of the discoloration of the Au plated film 9 upon heat treatment. It will be understood from FIG. 3 that when the thickness of Ni plated film is set to 2 μm or more, the discoloration hardly occurs in the Au plated film upon heat treatment. Therefore, in the embodiment of the invention, the thickness of secondary Ni plated film was set to about 3 μm.

On the other hand, in the foregoing plating processing step, the honing has been executed for the wiring metalized film 5. However, in the present invention, the honing process for the wiring metalized film 5 is not necessarily executed. Further, in the invention, an Ni plating film as similar metal or a plating film of metal other than them can be also used in place of the Au plated film 9.

According to the foregoing invention, in the case of executing the multilayer plating, the decomposed portion can be removed by executing the honing process to the surface of metal as an underlayer. In addition, since its surface is made rough, the anchor effect is produced. Therefore, there is an advantage such that a uniform multilayer plated film of a good adhesive property can be formed.

As described above, according to the invention, a multilayer plated film having a good adhesive property can be formed on dissimilar metal. Particularly, a large advantage can be obtained when the invention is used in an application such that a plated film for connection of the ceramic module substrate is formed or the like.

We claim:

1. A multilayer plating method comprising the steps of:
    forming a primary plated film onto a surface of underlayer metal;
    performing a heating process thereafter;
    forming a diffusion layer near a boundary surface between said underlayer metal and said primary plated film by a mutual diffusion;
    executing a mechanical abrasion to the surface of said primary plated film thereafter;
    exposing said diffusion layer; and
    forming a secondary plated film onto said exposed diffusion layer.

2. A method according to claim 1, wherein said secondary plated metal is made of metal dissimilar to said underlayer metal.

3. A method according to claim 1, wherein a mechanical abrasion is executed to the surface of said underlayer metal.

4. A method according to claim 3, wherein an alumina honing is used for the mechanical abrasion of the surface of said underlayer metal.

5. A method according to claim 1, wherein an alumina honing is used for the mechanical abrasion of the surface of said primary plated film.

6. A method according to claim 1, wherein the heating process is reexecuted after said secondary plated film was formed.

7. A method according to claim 1, wherein a wiring metalized layer made of tungsten on a module substrate is used as underlayer metal,
    and nickel is used as the primary plated film and the secondary plated film.

8. A method according to claim 7, wherein a thickness of film of nickel serving as the secondary plated film is set to a value within a range from 2 $\mu$m to 5 $\mu$m.

9. A multilayer plated film which is formed on underlayer metal and comprises:
   a diffusion layer which is formed by mutually diffusing said underlayer metal and a primary plated film formed on the surface of the underlayer metal by a heating process and in which an upper surface of said diffusion layer is a mechanically abraded surface; and
   a secondary plated film formed on the diffusion layer.

10. A multilayer plated film according to claim 9, wherein a wiring metalized layer made of tungsten on a module substrate constructs the underlayer metal, and nickel constructs the primary plated film and the secondary plated film.

11. A multilayer plated film according to claim 10, wherein a thickness of film of nickel serving as the secondary plated film is set to a value within a range from 2 $\mu$m to 5 $\mu$m.

* * * * *